(12) United States Patent
Yamashita

(10) Patent No.: US 6,378,098 B1
(45) Date of Patent: Apr. 23, 2002

(54) SEMICONDUCTOR TEST SYSTEM

(75) Inventor: Kazuhiro Yamashita, Sugito-machi (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/264,768

(22) Filed: Mar. 9, 1999

(30) Foreign Application Priority Data

Mar. 19, 1998 (JP) .............................................. 10-70103

(51) Int. Cl.[7] .............................................. G01R 31/28
(52) U.S. Cl. ...................................... 714/742; 714/741
(58) Field of Search ................................. 714/738, 742, 714/744, 724, 725, 726, 728, 731–38

(56) References Cited

U.S. PATENT DOCUMENTS

| | | | |
|---|---|---|---|
| 5,524,114 A | * 6/1996 | Peng ........................... | 714/724 |
| 5,581,177 A | * 12/1996 | Hussey et al. ........... | 324/158.1 |
| 5,940,875 A | 8/1999 | Imagaki et al. ............. | 711/217 |
| 5,978,942 A | * 11/1999 | Rockoff ....................... | 714/724 |
| 6,018,814 A | * 1/2000 | Rockoff ....................... | 714/724 |
| 6,094,738 A | 7/2000 | Yamada et al. ............. | 714/738 |
| 6,275,057 B1 | 8/2001 | Takizawa ..................... | 324/765 |

* cited by examiner

*Primary Examiner*—Albert Decady
*Assistant Examiner*—Emeka J. Amanze
(74) *Attorney, Agent, or Firm*—Muramatsu & Associates

(57) ABSTRACT

A semiconductor test system for efficiently testing a semiconductor device (DUT) having a phase lock loop (PLL) circuit therein. The semiconductor test system includes a first clock and waveform generator for supplying a clock signal to the PLL circuit at a start of the first pattern block, a second clock and waveform generator for supplying pattern data to the DUT during each of the pattern blocks, a pattern generator for generating pattern data, and a timing generator for generating a tester rate signal, a clear signal, and a gate signal for controlling the tester rate signal and the clear signal in the first and second clock and waveform generators. The clock signal is continuously provided to the PLL circuit until the end of the last pattern block while the pattern data to the data pin is reset between the end of the current pattern block and the start of the next pattern block.

3 Claims, 5 Drawing Sheets

1

SEMICONDUCTOR TEST SYSTEM

FIELD OF THE INVENTION

This invention relates to a semiconductor test system for testing semiconductor integrated circuits such as ICs and LSIs, and more particularly to a semiconductor test system which can efficiently test semiconductor integrated circuits having PLL (phase lock loop) circuits.

BACKGROUND OF THE INVENTION

In testing semiconductor devices such as ICs and LSIs by a semiconductor test system, such as an IC tester, a semiconductor IC device to be tested is provided with test pattern data produced by an IC tester at its appropriate pins at predetermined test timings. The IC tester receives output signals from the IC device under test generated in response to the test pattern data. The output signals are sampled by strobe signals with predetermined timings to be compared with expected data to determine whether the IC device functions correctly.

Some IC devices include therein phase lock loop (PLL) circuits for generating internal clock signals. A phase lock loop (PLL) circuit locks the phase of internal clock signal generated by an internal clock oscillator to the phase of a reference clock signal given from an outside source. Examples of IC devices having PLL circuits include microcomputers and RISC processors. One of the advantages of a PLL circuit is that it can produce a clock signal of reduced jitters or phase fluctuations.

FIG. 3 is a schematic diagram showing a structure for testing an IC device having a phase lock loop circuit by a semiconductor test system. In this example, an IC device under test (DUT) 40 includes a phase lock loop (PLL) circuit 45 to produce an internal clock (PLL clock) signal based on a clock signal received at a clock pin 41.

Before going into the relationship between the semiconductor test system and the PLL circuit 45 in the DUT 40, a brief description is made regarding the structure and operation of a PLL circuit. An example of a PLL circuit is shown in FIG. 5 which is comprised of a phase detector (phase comparator) 46, a loop filter 47 and a voltage controlled oscillator (VCO) 48.

The phase detector 46 compares the phase of an input clock signal (CLK) and an oscillation signal (PLL CLK) of the VCO 48 and produces an phase error signal which represents a phase difference between the two signals. Upon receiving the phase error signal from the phase detector 46, the loop filter 47 converts the phase error signal to an averaged DC voltage. Typically, the loop filter 47 is a low pass filter formed by analog or digital components.

The VCO 48 is an oscillator wherein the oscillation frequency is controlled by the averaged DC voltage of the loop filter 47. Because of the negative feedback loop, the PLL circuit controls oscillation frequency of the VCO 48 such that the oscillation frequency of the VCO 48 matches with the input clock signal.

The PLL circuit basically performs a two step operation in which the phase synchronization is reached (lock end) after a pull-in step in which the frequency of the VCO 48 approaches close proximity with the reference clock frequency and a lock-in step in which the phase of the two signals are synchronized with one another. By being applied to an inner clock signal (PLL clock), the PLL circuit can reduce the jitters of the clock signal from external sources, or acts as a clock buffer of zero phase delay.

The configuration and function of the semiconductor test system that tests the DUT 40 having the PLL circuit is explained in the following with reference to FIGS. 3 and 4. The configuration of FIG. 3 shows only functional blocks for generating test pattern data and clock signals to be applied to the DUT 40. The main functional blocks in the semiconductor test system for generating the test pattern data and the clock signal include a timing generator 10, a pattern generator 20, and clock and waveform generators $30_0$ and $30_1$.

The clock and waveform generators $30_0$ and $30_1$ commonly receive various signals from the timing generator 10 and the pattern generator 20. The clock and waveform generator $30_0$ provides a clock signal to the clock pin 41 of the DUT 40 and the clock and waveform generator $30_1$ provides the test data to the data pin 42 of the DUT. Although only one data pin is shown in FIG. 3 for the simplicity of explanation, the DUT 40 usually has many data pins such as several tens to several hundreds pins. Accordingly, in an actual semiconductor test system, a large number of clock and waveform generators $30_1$–$30_n$ for data pins are prepared, although not shown here.

The timing generator 10 generates a reference clock RCLK 100, a tester rate signal 200, and a clear signal 300. The reference clock RCLK 100 is a reference clock signal of the semiconductor test system produced by a high stable oscillator such as a crystal oscillator. The reference clock RCLK is used to generate clock edges for producing the tester rate signal 200 and the test pattern data 620. The reference clock RCLK has a frequency of, for example, 100 MHz.

The tester rate signal 200 is also called a test cycle signal and is generated based on desired number of periods of the reference clock RCLK. Generally, timings of test pattern data and strobe signals (not shown) in each test cycle (tester rate) are defined based on a starting edge of the tester rate signal. In a modern semiconductor test system, the time interval of the tester rate signal is dynamically changed under the control of a test program.

The clear signal 300 is to clear (reset) the previous data setting before starting the next set (block) of test patterns. The pattern generator 20 generates the pattern data 600 which includes test data 620 to be applied to the data pin 42 of the DUT 40 and the expected data (not shown) to compare the resultant output of the DUT 40.

The clock and waveform generator $30_0$ generates a clock signal 120 which is applied to the clock pin 41 of the DUT 40. The clock and waveform generator $30_1$ generates the test pattern data 620 which is applied to the data pin 42 of the DUT 40. The clock signal 120 is produced based on the reference clock RCLK and the tester rate signal 200. The test pattern data 620 is produced based on the pattern data 600 with use of the reference clock RCLK 100 and the tester rate signal 200.

The procedure for testing the DUT 40 having the PLL circuit 45 by the semiconductor test system of FIG. 3 is explained with reference to the timing chart of FIG. 4. FIG. 4 is directed to a process for conducting a function test on the DUT. In general, the function test of an IC device under test is carried out by supplying the test pattern data which is divided into a large number of pattern blocks to the IC device. In FIG. 4, before the start of the function test, the PLL circuit 45 in the DUT 40 has to be brought to the lock end (phase lock state) by applying the clock signal 120 to the PLL circuit 45.

In the arrangement of the conventional technology of FIG. 3, the clock signal 120 to the PLL circuit 45 stops when the tester rate signal 200 stops. If the clock signal is not supplied, the phase lock state in the PLL circuit 45 is destroyed (out of phase lock).

As stated above, in general, when a function test is performed for an IC device, the overall test pattern is separated into several hundred blocks to several thousand blocks of test patterns. Thus, the test patterns are generated continuously in the unit of several 10k patterns or several 100k patterns for each pattern block. Prior to the start of each of the blocks of test patterns, the clock signal 120 must be provided to the PLL circuit 45 to bring the PLL circuit 45 to the phase lock state. Since the PLL circuit 45 needs a certain length of time, such as several milliseconds, to reach the phase lock state (lock end) for each block of the test pattern, a significant amount of time is required to phase lock the PLL circuit to complete the function test.

This operational process in the conventional semiconductor test system is shown in the timing chart of FIG. 4. Such an operational procedure is itemized in the following.

(1) Before the start of the test pattern (pattern start) of a test pattern block, the previous data in the clock and waveform generators $30_0$ and $30_1$ is cleared (reset) by the clear signal 300.

(2) The tester rate signal 200 is generated at the start of the test pattern, which produces the clock signal 120 in the clock and waveform generator $30_0$. The clock signal 120 is applied to the clock pin 41 of the DUT 40.

(3) By controlling the pattern PAT 600 supplied to the clock and waveform generator $30_1$, the pattern data 620 applied to the data pin 42 of the DUT 40 is fixed to a LOW level, i.e., the pattern data 620 is not provided to the DUT 40.

(4) When the PLL circuit 45 in the DUT 40 has reached the lock end condition, the test pattern data 620 from the clock and waveform generator $30_1$ is applied to the data pin 42 of the DUT 40. The time required for the PLL circuit to reach the lock state, that is, the time from the pattern start to the lock end, is several milliseconds.

(5) When the tester rate 200 stops at the end of the pattern block (pattern stop), the clock signal 120 from the clock and waveform generator $30_0$ also stops, and the phase lock in the PLL circuit 45 is broken.

(6) The last data in the clock and waveform generators $30_0$ and $30_1$ are cleared again by the clear signal 300. The time required to clear the data, that is, a time length from the pattern stop to the next pattern start, corresponds to a time length for executing each step of the software of the test system, which is several microseconds.

(7) The test patterns are repeatedly generated by repeating the steps of (2)–(6) described above, and the function test for the DUT 40 is performed for all of the pattern blocks of the test pattern.

As in the foregoing, when testing the DUT 40 having the PLL circuit 45 therein, at the start of the test pattern of each pattern block, the PLL circuit 45 must be phase locked. As noted above, there involves as many as several hundred pattern blocks to several thousand blocks in the functional test of the DUT 40, and the time required for reaching the phase lock is relatively long, such as several milliseconds. Thus, the overall test time is increased by the amount of time which is a multiple of the time required to lock the PLL circuit 45 in the DUT 40 and the number of pattern blocks used in the test. Compared to the time required to reach the lock end for the PLL circuit which is several milliseconds, the time required for a clear process is negligible since it is in the order of several microseconds as noted above.

As in the foregoing, when the semiconductor having a PLL circuit is tested by the conventional semiconductor test system, there is a disadvantage that the overall test time is increased by the amount equal to the time required to lock the PLL circuit 45 multiplied by the number of pattern blocks involved in the function test.

SUMMARY OF THE INVENTION

Therefore, it is an object of the present invention to provide a semiconductor test system which is capable of testing a semiconductor device having a PLL circuit therein without increasing the overall test time.

It is another object of the present invention to provide a semiconductor test system which is capable of testing a semiconductor device having a PLL circuit with high efficiency by continuously supplying a clock signal to the PLL circuit during the transition period between one pattern block to the next pattern block.

It is a further object of the present invention to provide a semiconductor test system which is capable of continuously supplying the clock signal to a PLL circuit in the semiconductor device throughout all of the test pattern blocks to maintain the phase lock state in the PLL circuit until the end of the overall test.

For testing a semiconductor device (DUT) having a phase lock loop (PLL) circuit therein by supplying pattern data which is divided into a large number of pattern blocks, the semiconductor test system of the present invention is comprised of: a first clock and waveform generator for supplying a clock signal to the PLL circuit in the DUT through a clock pin at a start of the first pattern block, a second clock and waveform generator for supplying pattern data to a data pin of the DUT during each of the pattern blocks, a pattern generator for generating pattern data which is supplied to the second clock and waveform generator based on a test program, and a timing generator for generating a tester rate signal which defines each test cycle in the test system, a clear signal for resetting the data in the first and second clock and waveform generators, and a gate signal for controlling the tester rate signal and the clear signal in the first and second clock and waveform generators, wherein the clock signal is continuously provided to the PLL circuit until the end of the last pattern block while the pattern data to the data pin is reset between the end of the current pattern block and the start of the next pattern block.

In the semiconductor test system of the present invention, the clear signal is inhibited by the gate signal in the first clock and waveform generator during the period between the end of the current pattern block and the start of the next pattern block so that the clock signal is continuously provided to the PLL circuit in the DUT, and the tester rate signal is inhibited by the gate signal in the second clock and waveform generator during the period between the end of the current pattern block and the start of the next pattern block so that the pattern data is not provided to the data pin of the DUT.

According to the present invention, when the function test of the DUT having the PLL circuit is performed, at the start of the first pattern block, it is necessary to establish the phase lock in PLL circuit. Thereafter, the phase lock state in the PLL circuit is maintained until the end of all of the pattern blocks. Thus, during each period between the end of the present pattern block and the start of the next pattern block, only the time to reset the data has to be spent rather than the time required for bringing the PLL circuit to the phase lock state. Hence, the overall test time is dramatically reduced by the amount of time which is a multiple of the time T required to phase lock the PLL circuit 45 in the DUT 40 and the total number N of pattern blocks used in the function test less one pattern block, i.e., T(N−1).

DETAILED DESCRIPTION OF THE PREFERRED EMBODIMENT

Figure 1:
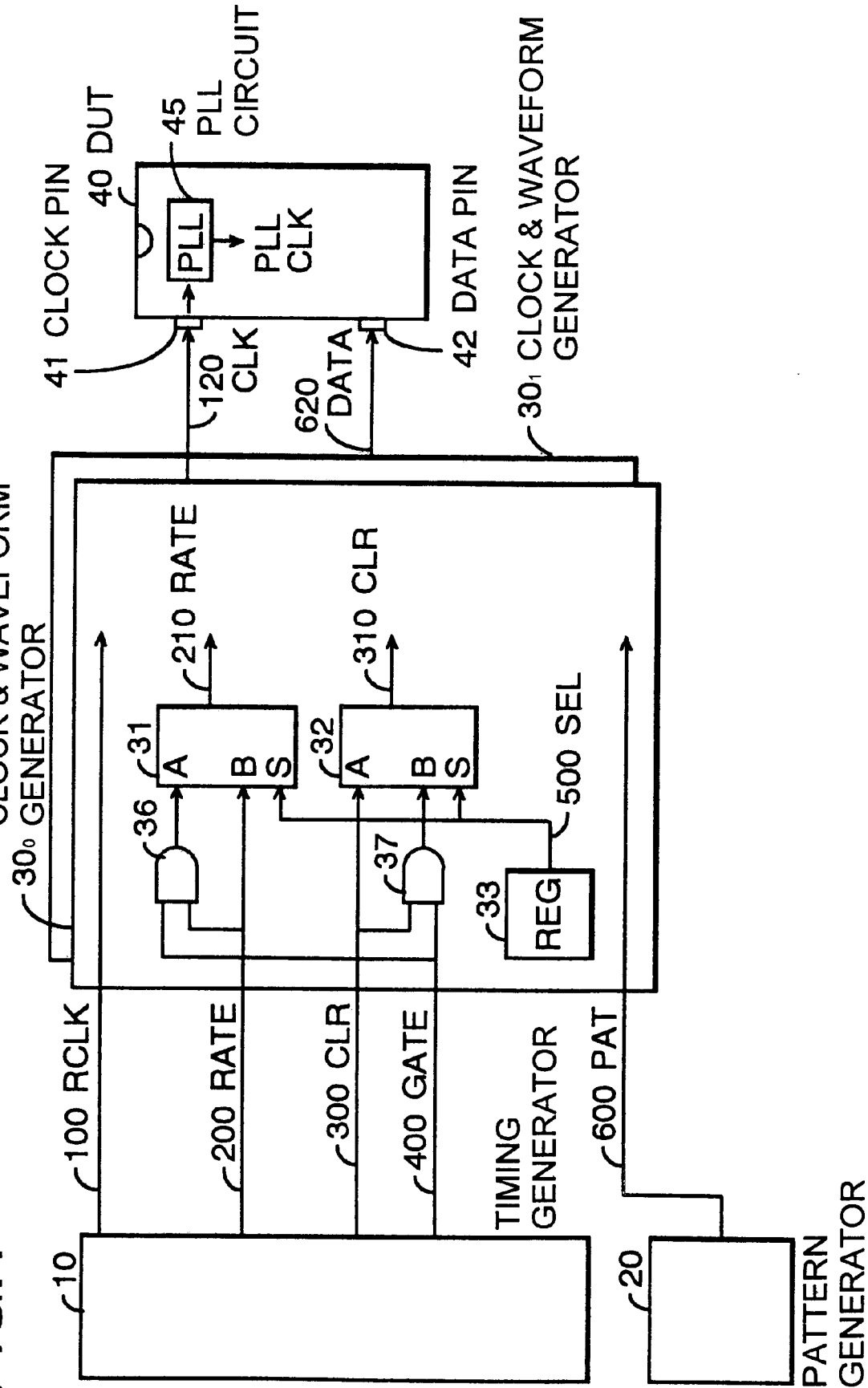
FIG. 1 is a block diagram showing the basic structure of semiconductor test system in the present invention.
Figure 2:
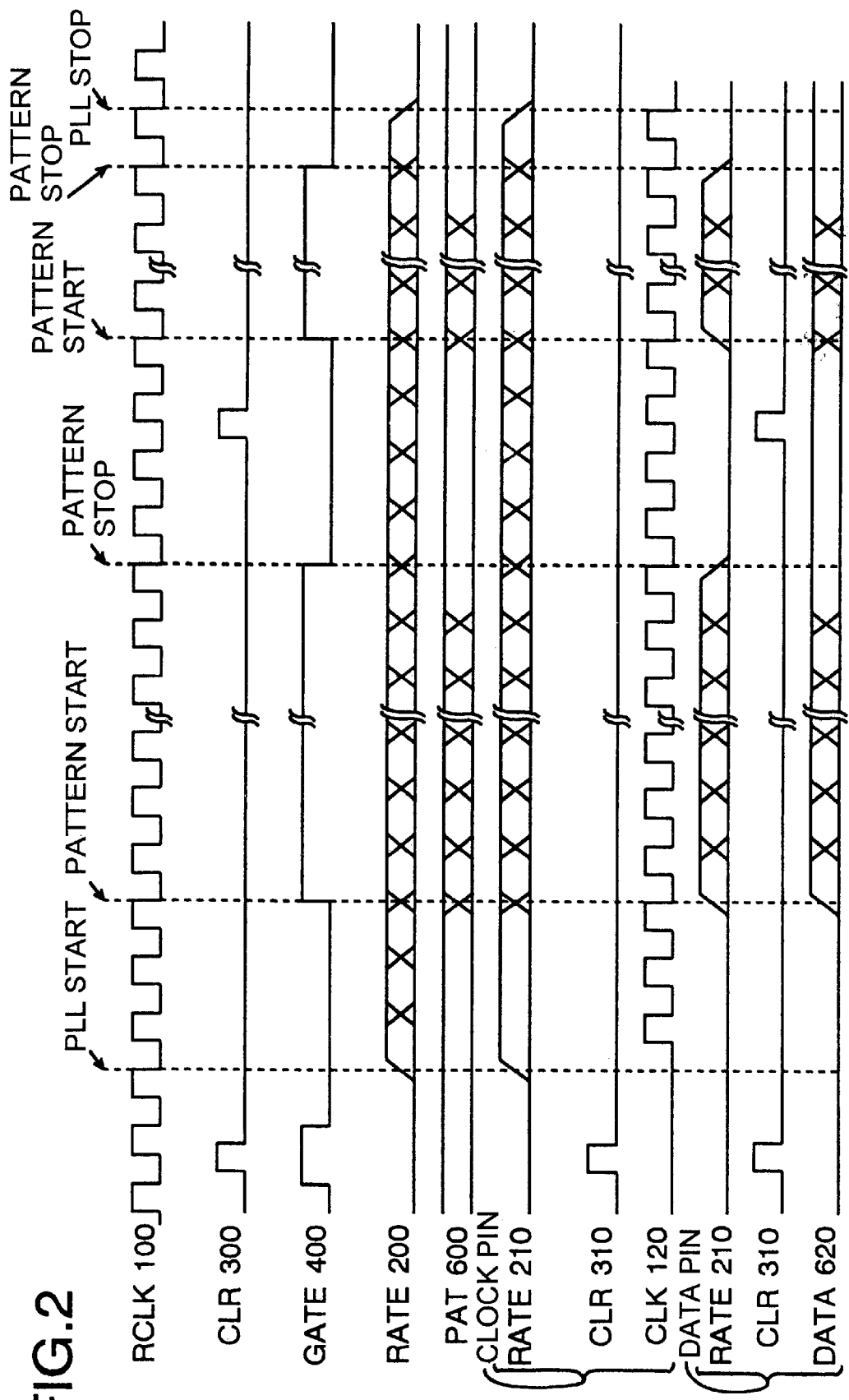
FIG. 2 is a timing chart showing the operation in the semicoductor test system of the present invention.
Figure 3:
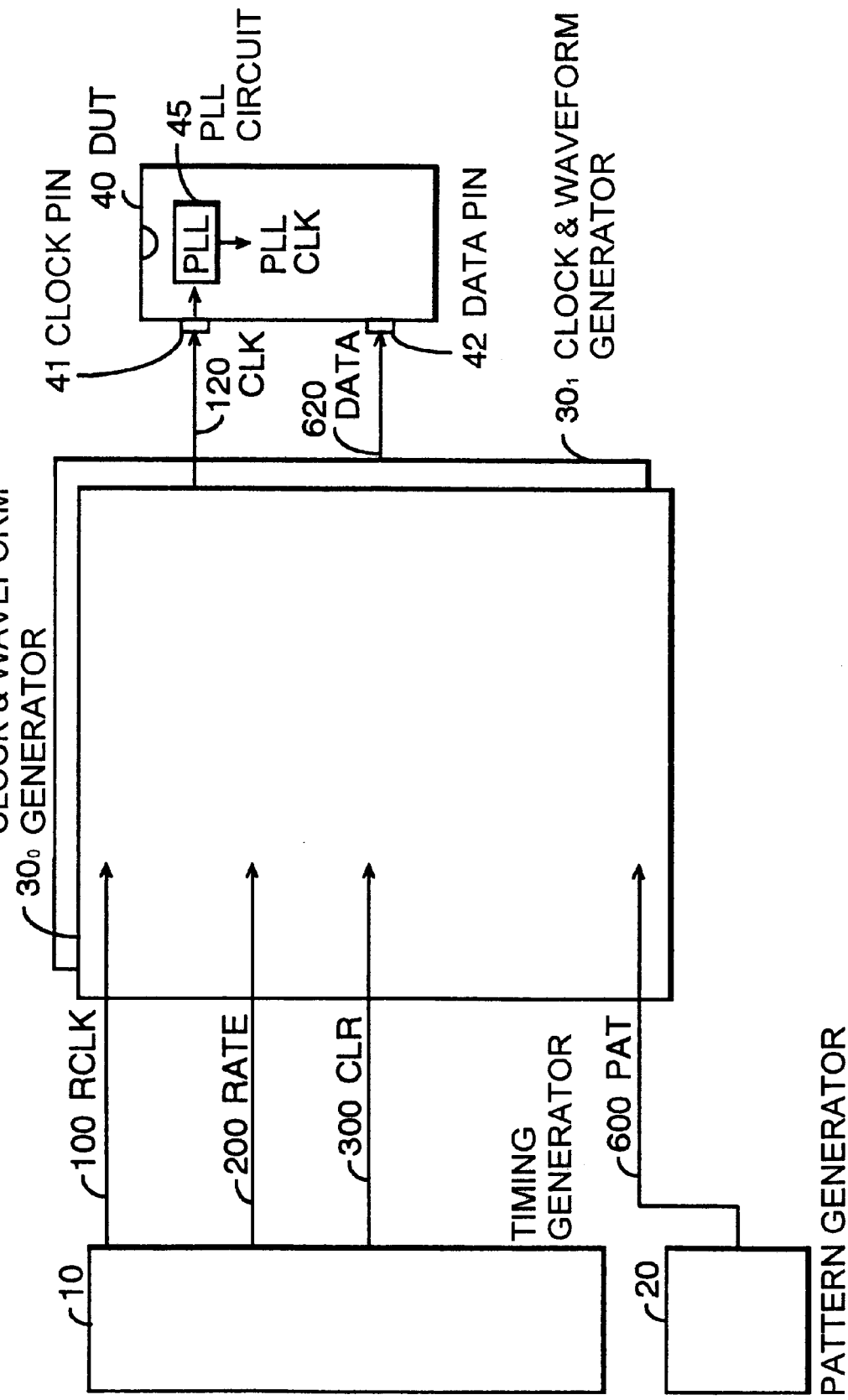
FIG. 3 is a block diagram showing the structure of semiconductor test system in the conventional technology.
Figure 4:
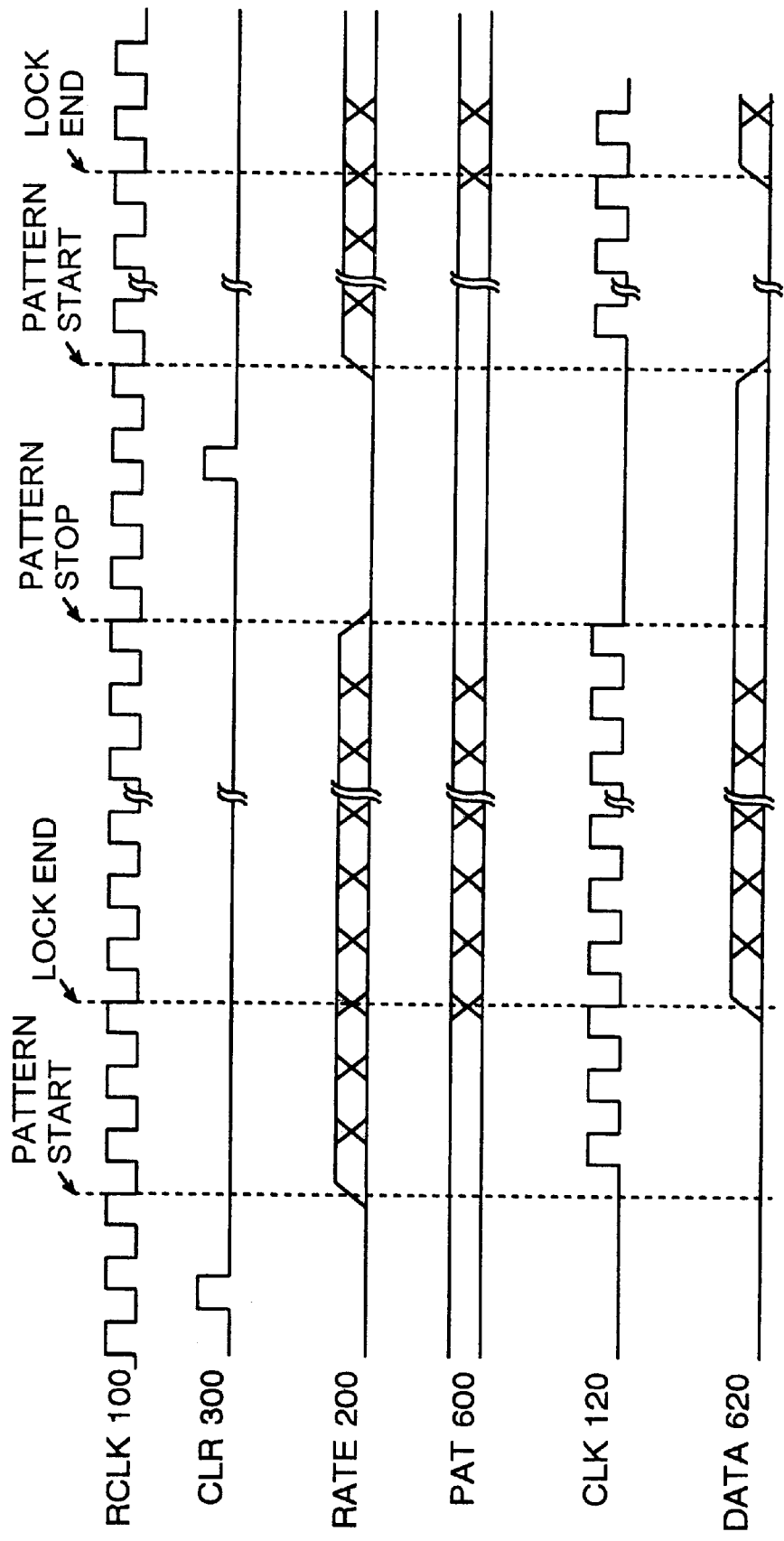
FIG. 4 is a timing chart showing the operation of semiconductor test system in the conventional technology of FIG. 3.
Figure 5:
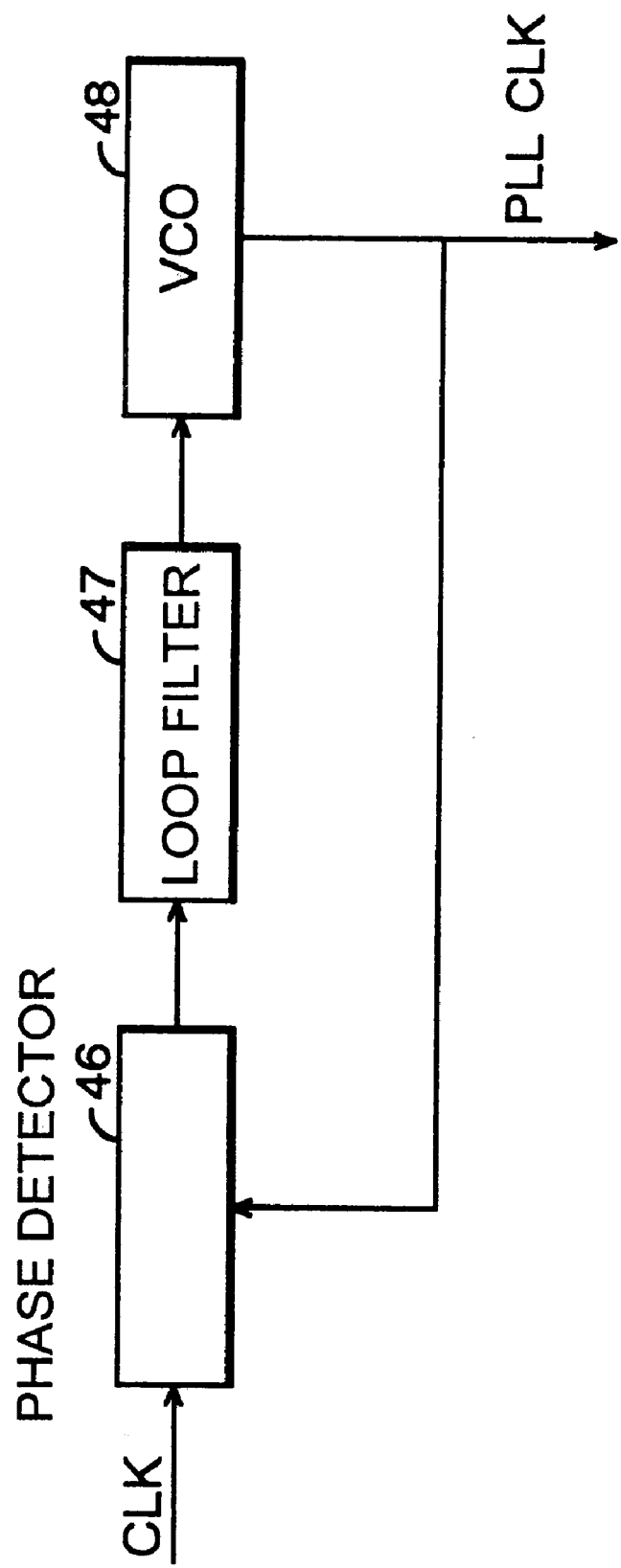
FIG. 5 is a block diagram showing a basic structure of a PLL (phase lock loop) circuit.

The embodiment of the present invention is explained with reference to FIGS. 1 and 2. FIG. 1 shows an essential portion of the semiconductor test system for testing an IC device (DUT) 40 having a PLL (phase lock loop) circuit therein. The example of FIG. 1 is to supply test signals including a clock signal to the DUT 40 and configured by a timing generator 10, a pattern generator 20, and a clock and waveform generators 30. A large number of clock and waveform generators 30 will be incorporated in an actual test system although only two of which, clock and waveform generators $30_0$ and $30_1$ are shown here.

The timing generator 10 generates a reference clock RCLK 100, a tester rate signal 200, and a clear signal 300. The reference clock RCLK 100 is a reference clock signal of the semiconductor test system produced by a high stability oscillator such as a crystal oscillator. The reference clock RCLK is used to generate clock edges for producing the tester rate signal 200 and the test pattern data 620. The reference clock RCLK has a frequency of, for example, 100 MHz.

The tester rate signal 200 is also called a test cycle signal and is generated based on the desired number of periods of the reference clock RCLK. Generally, timings of test pattern data and strobe signals (not shown) in each test cycle (tester rate) are defined based on a starting edge of the tester rate signal. In a modern semiconductor test system, the time interval of the tester rate signal is dynamically changed under the control of a test program.

The clear signal 300 is to clear the previous data setting before starting the next set (block) of test patterns. The pattern generator 20 generates pattern data PTA 600 which includes test pattern data 620 to be applied to the data pin 42 of the DUT 40 and the expected data (not shown) to compare the resultant output of the DUT 40.

The clock and waveform generator $30_0$ produces a clock signal 120 which is applied to the clock pin 41 of the DUT 40. The clock and waveform generator $30_1$ generates the test pattern data 620 which is applied to the data pin 42 of the DUT 40. The clock signal 120 is produced based on the reference clock RCLK and the tester rate signal 200. The test pattern data 620 is produced based on the pattern data 600 with use of the reference clock RCLK 100 and the tester rate signal 200.

In the present invention, each of the clock and waveform generators 30 in the semiconductor test system includes multiplexers 31 and 32, a register 33, and AND gates 36 and 37. The AND gate 36 is provided with the tester rate signal 200 and the gate signal 400 at its input and an output of which is connected to the terminal A of the multiplexer 31. The tester rate signal 200 is also directly provided to the terminal B of the multiplexer 31. The AND gate 37 is provided with the clear signal 300 and the gate signal 400 at its input and an output thereof is connected to the terminal B of the multiplexer 32. The clear signal 300 is also directly provided to the terminal A of the multiplexer 32. Based on the data stored therein the register 33 provides a select signal 500 to the multiplexers 31 and 32.

The multiplexers 31 and 32 respectively select the data at the input terminals A when the select signal 500 from the register 33 is "0", and the data at the input terminals B when the selection signal 500 is "1". The select signal 500 from the register 33 is set to "1" for the clock and waveform generator $30_0$ connected to the clock pin 41 of the DUT 40 so that the data at the B terminals are selected by the multiplexers 31 and 32. The select signal 500 from the register 33 is set to "0" for the clock and waveform generator $30_1$ connected to the data pin 42 of the DUT 40 so that the data at the A terminals are selected by the multiplexers 31 and 32.

Therefore, in the clock and waveform generator $30_0$ connected to the clock pin 41 of the DUT 40, the rate signal 210 at the output of the multiplexer 31 is the same as the rate signal 200 provided to the terminal B. The clear signal 310 at the output of the multiplexer 32 is derived from the AND gate 37 connected to the terminal B. In contrast, in the clock and waveform generator $30_1$ connected to the data pin 42 of the DUT 40, the rate signal 210 at the output of the multiplexer 31 is derived from the AND gate 36 connected to the terminal A. The clear signal 310 at the output of the multiplexer 32 is the same as the clear signal 300 provided to the terminal A.

The operational process semiconductor test system of the present invention is shown in the timing chart of FIG. 2, which is itemized in the following.

(1) In the clock and waveform generator $30_0$ which supplies the clock signal to the clock pin 41, since the gate signal 400 is in the high-level, the clear signal 310 is produced at the output of the multiplexer 32. The clear signal 310 resets the last data in the clock and waveform generator $30_0$. In the clock and waveform generator $30_1$ which supplies the data to the data pin 42, since the terminal A is selected, the clear signal 310 is produced at the output of the multiplexer 32. The clear signal 310 resets the last data in the clock and waveform generator $30_1$.

(2) In the clock and waveform generator $30_0$, the tester rate signal 210 is produced at the output of the multiplexer 31, thereby generating the clock signal 120 which is provided to the clock terminal 41. The negative feedback operation in the PLL circuit 45 in the DUT 40 is initiated to phase lock the internal clock oscillator to the clock signal 120. In the clock and waveform generator $30_1$ connected to the data pin 42, the tester rate signal 210 is not produced because the gate signal 400 is in the low level. Thus, the test pattern data 620 is not provided to the data terminal 42.

(3) In the clock and waveform generator $30_0$, the clock signal 120 is continuously supplied to the PLL circuit through the clock pin 41 to maintain the phase lock state. In the clock and waveform generator $30_1$, as soon as the PLL circuit 45 is locked (lock end), the gate signal 400 changes to the high level so that the tester rate signal 210 is output at the output of the multiplexer 31. Thus, the test pattern data 620 is produced which is provided to the data pin 42. The test pattern data 620 for the first block of function test is continuously applied to the data pin 42.

(4) At the end of the first block of the function test, the test patterns end (pattern stop). At this time, the gate signal 400 goes to the low level, and the clear signal 310 is not output in the clock and waveform generator $30_0$ connected to the clock pin 41. Further in the clock and waveform generator $30_0$, the tester rate signal 210 is continuously generated by selecting the terminal B of the multiplexer 31. Thus, the clock signal 120 is not cleared (reset) and continuously supplied to the PLL circuit 45, i.e., the phase lock state therein is not disturbed. In the clock and waveform generator $30_1$ connected to the data pin 42, since the gate signal 400 is in the low level, the tester rate signal 210 is not available from the multiplexer 31. Therefore, test pattern data 620 is not provided to the data pin 42 of the DUT 40.

(5) Until the start of the next block of the function test, the gate signal 400 remains the low level. Thus, in the clock and waveform generator $30_0$, the clear signal 310 is not generated. Consequently, the clock signal 120 and the tester rate signal 210 are continuously produced. In the clock and waveform generator $30_1$, on the other hand, the clear signal is generated from the multiplexer 32 since the terminal A is fixedly selected. Thus, the prior data in the clock and waveform generator $30_1$ is reset by the clear signal 310. At the start of the next pattern block, the gate signal 400 changes to the high level so that the tester rate signal 210 is output at the output of the multiplexer 31. Thus the test pattern data 620 is produced in the clock and waveform generator $30_1$ and is provided to the data pin 42.

(6) By repeating the steps (3)–(5) in the above until all of the test pattern data in all of the test pattern blocks are generated, the functional test ends.

(7) The test program proceeds to terminate the tester rate signal 200. Thus, the clock signal 120 is no longer generated by the clock and waveform generator $30_0$. The test program also sets the gate signal 400 to the low level, which prohibits the tester rate signal 210 from the multiplexer 31 in the clock and waveform generator $30_1$, thereby also terminating the test pattern data 620.

As in the foregoing, during the period from the pattern stop of the first pattern block to the start of the next pattern block, the clock signal 120 to the clock pin 41 of the DUT 40 is continuously supplied from the clock and waveform generator $30_0$. Thus, the PLL circuit 45 in the DUT 40 maintains the phase lock condition. During this period, in the clock and waveform generator $30_1$ for the data pin 42, the previous data is reset by the clear signal 310. Thus, the pattern data is not supplied to the data pin 42.

Therefore, in the present invention, after establishing the phase lock state in the PLL circuit 45, the phase lock state is maintained until the end of all of the pattern blocks. Thus, during each period between the end of the present pattern block and the start of the next pattern block, only the time to reset the data has to be spent rather than the time required for bringing the PLL circuit to the phase lock state. Hence, the overall test time is significantly reduced because only one lock-in process is performed in the PLL circuit throughout the test.

In the foregoing example, the gate signal 400 controls the tester rate signal 200 and the clear signal 300 to be applied to the multiplexers 31 and 32, and the register 33 provides the select signal to the multiplexers 31 and 32 in the clock and waveform generators 30 connected to the clock pin 41 and data pin 42. Another implementation of the present invention is also possible by generating two kinds of tester rates and two kinds of clear signals, respectively, by the timing generator. Each of the clock and waveform generators selects one of the tester rates and clear signals, to form the signal to be supplied to the corresponding pins of the DUT.

According to the present invention, when the function test of the DUT 40 having the PLL circuit 45 is performed, at the start of the first pattern block, it is necessary to establish the phase lock in PLL circuit 45. Thereafter, the phase lock state in the PLL circuit 45 is maintained until the end of all of the pattern blocks. Thus, during each period between the end of the present pattern block and the start of the next pattern block, only the time to reset the data has to be spent rather than the time required for bringing the PLL circuit to the phase lock state. Hence, the overall test time is significantly shortened by the amount of time which is a multiple of the time T required to lock the PLL circuit 45 in the DUT 40 and the total number N of pattern blocks used in the function test less one pattern block, i.e., T(N−1).

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system for testing a semiconductor device (DUT) having a phase lock loop (PLL) circuit therein by supplying test pattern data divided into a large number of test pattern blocks, comprising:

a first clock and waveform generator for supplying a clock signal to the PLL circuit in the DUT through a clock pin of the DUT at a start of the first test pattern block;

a second clock and waveform generator for supplying pattern data to a data pin of the DUT during each of the test pattern blocks;

a pattern generator for generating test pattern data which is supplied to the second clock and waveform generator based on a test program; and a timing generator for generating a tester rate signal which defines each test cycle in the test system, a clear signal for resetting the data in the first and second clock and waveform generators, and a gate signal for controlling the tester rate signal and the clear signal in the first and second clock and waveform generators;

wherein the clock signal is continuously provided to the PLL circuit in the DUT from a predetermined time prior to the start of the first test pattern block until the end of the last test pattern block while the test pattern data to the data pin is reset between the end of one test pattern block and the start of the next test pattern block, thereby continuously maintaining the PLL circuit in the DUT in a phase lock state throughout application of all of the test pattern blocks to the DUT.

2. A semiconductor test system as defined in claim 1, wherein the clear signal is inhibited by the gate signal in the first clock and waveform generator during each period between the end of one test pattern block and the start of the next test pattern block so that the clock signal is continuously provided to the PLL circuit in the DUT, and the tester rate signal is inhibited by the gate signal in the second clock and waveform generator during each period between the end of one test pattern block and the start of the next test pattern block so that the test pattern data is not provided to the data pin of the DUT during the period.

3. A semiconductor test system as defined in claim 1, wherein each of the first and second clock and waveform generators includes:
- a first multiplexer for selectively producing the tester rate signal, the first multiplexer directly receiving the rate signal from the timing generator at its second terminal;
- a second multiplexer for selectively producing the clear signal, the second multiplexer directly receiving the clear signal from the timing generator at its first terminal;
- a first gate circuit for receiving the tester rate signal and the gate signal from the timing generator and providing an output signal to a first terminal of the first multiplexer;
- a second gate circuit for receiving the clear signal and the gate signal from the timing generator and providing an output signal to a second terminal of the second multiplexer;
- a register for providing a select signal to the first and second multiplexers;
- wherein the select signal in the register is set in such a way that the first and second multiplexers in the first clock and waveform generator select the second terminals thereof while the first and second multiplexers in the second clock and waveform generator select the first terminals thereof.

* * * * *